United States Patent
Haynie et al.

(10) Patent No.: US 6,423,909 B1
(45) Date of Patent: Jul. 23, 2002

(54) CIRCUIT BOARD CONSTRUCTION FOR DIFFERENTIAL BUS DISTRIBUTION

(75) Inventors: Carl R. Haynie, Pilot Hill; David Dickey; James J. deBlanc, both of Roseville, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/795,603

(22) Filed: Feb. 27, 2001

(51) Int. Cl.[7] .............................................. H01R 12/04
(52) U.S. Cl. ....................... 174/261; 174/260; 361/778; 361/805
(58) Field of Search ................................ 174/261, 260, 174/68.2, 71 R, 72 R, 72 A, 250; 361/777, 748, 749, 751, 778, 805

(56) References Cited

U.S. PATENT DOCUMENTS

| | | | | |
|---|---|---|---|---|
| 5,010,446 A | * | 4/1991 | Scannell | 324/158.1 |
| 5,012,389 A | * | 4/1991 | Perry | 361/684 |
| 5,610,642 A | * | 3/1997 | Nobel et al. | 347/50 |
| 5,771,158 A | * | 6/1998 | Yamagishi et al. | 174/261 |
| 5,844,783 A | * | 12/1998 | Kojima | 174/261 |
| 5,903,442 A | * | 5/1999 | Kanai et al. | 360/97.1 |
| 6,011,695 A | * | 1/2000 | Dumke | 174/261 |

* cited by examiner

Primary Examiner—Kamand Cuneo
Assistant Examiner—José H. Alcalá

(57) ABSTRACT

A circuit board including differential bus traces on or buried within both sides of the board, interconnecting electronic devices such as disk drives, processors, and connectors for external cables. Via fields, which mimic the size and configuration of the device and cable connector fields, are located between each connector on the board. The via fields link bus traces on or within one side of the board with respective bus traces on or within the other side of the board. The via fields may include subtle, unequal undulations in the trace patterns to provide equalization in the lengths of all trace pairs. The via fields and the connector fields both include repetitive conductor order reversals in the trace connections on opposing sides of the board, to reduce crosstalk between channels. The via fields may be oriented parallel with respect to collinearly arranged devices, or orthogonal with respect to devices or connectors which are parallel. Where a connector has laterally offset groups of pin connections, a via field may also include offset groups of vias to provide trace length equalization.

25 Claims, 7 Drawing Sheets

CIRCUIT BOARD CONSTRUCTION FOR DIFFERENTIAL BUS DISTRIBUTION

BACKGROUND OF THE INVENTION

1. Field of the Invention

The invention relates generally to improvements in circuit boards useful for supporting and interconnecting computer devices, such as disk drives and processors. More specifically, the invention pertains to multi-layered circuit boards including differential buses and special via fields, to provide high speed signal transfers between and among electronic devices.

2. Description of the Prior Art

Modern computer systems use high speed digital buses to connect high performance computer devices, such as disk drives and processors. Generally, these buses comprise a plurality of parallel, conductive wires or traces. The bus wires are typically arranged on a printed circuit board, which may have inner or outer traces of bus wires separated by non-conductive core material. Active terminating loads, designed to match trace characteristic impedances, are provided at the end of each wire or trace. These loads include a load resistor, and may also include a voltage source or a current source.

The computer devices are connected to traces in the intermediate portion of the bus by means of wire stubs. The wire stubs extend across the bus, providing a parallel electrical connection for the transversely positioned device. Because stubs are transverse to the bus, stubs introduce signal perturbations and noise artifacts into the data transmitted through the bus of the computer system.

The use of stubs creates other problems in the design of circuit board layouts. It is typical to plug the computer devices into connectors or sockets, mounted to the printed circuit board. The stubs or other connection traces lead from the pins of the connectors to the bus. As the complexity of the computer system increases, the number of devices which must be connected to the bus also increases. However with a greater number of devices to mount on the board and to interconnect to the bus, the circuit layout of the board becomes increasingly difficult to implement. The long, parallel traces between devices must be routed to maintain a specific trace impedance, minimize crosstalk, minimize consumption of circuit board space, equalize the trace lengths, and use the least number of board layers. As a result, compromises are made in the performance of the computer system, so that all the devices can be interconnected as required.

Buses used for interconnecting devices may be either of single-ended or differential design Single-ended buses rely upon circuits comprised of a plurality of single conductors, spaced and insulated from a ground plane which is common to all conductors. Although single-ended buses are relatively easy to implement, they have significant limitations in data transfer rates, and are subject to adjacent channel noise interference, as well.

Differential buses, in contrast, use a pair of conductors, or trace-pairs, arranged in spaced relation and insulated from a ground plane. The predetermined spacing between the two conductors, in conjunction with the insulating dielectric and the ground plane, provide a controlled impedance layer for the rapid and efficient transfer of digital data. Both of the conductors are electrically above the ground plane at all times. Transmitters and receivers are employed at each end of the trace-pairs to encode and decode a predetermined signal differential between them. Consequently, differential buses provide the advantages of increased data rate transfer and greater immunity from noise, when compared to single-ended buses. However, because differential buses require two traces, they further restrain the options for circuit board layout and design.

In view of the above-noted difficulties in prior art designs, the need exists for a circuit board construction which allows the use of differential buses, and permits connectors for electronic devices and cables to be conveniently and efficiently located on the board.

SUMMARY OF THE INVENTION

The apparatus of the present invention employs a four-layered printed circuit board, for the purpose of mounting and electrically interconnecting two or more computer devices. These devices may include disk drives, processors, and external cables. Each of these devices is adapted to plug into a conventional device connector, such as a four row, twenty column SCSI (Small Computer System Interface) disk drive connector. The connectors may be located where desired on either side oft he circuit board, for example, in a line along one edge, or on opposing edges of the board.

Each connector includes at least one connector trace field, for connection to a differential bus. If the connector is to be connected to two connectors, then it includes two connector trace fields. The connector trace field provides a conductive transition between the pins of the connector and the bus. The differential bus is comprised of a plurality of trace-pairs of conductors, extending between adjacent computer devices. The first length of the differential bus is on a top side of the board, and the second length of the bus is on the bottom side of the board.

A via trace field is provided to interconnect the first and second lengths of the bus. The via trace field includes a top via field and a bottom via field. These via trace fields are substantially identical in configuration and size to the conductor trace fields. Vias, providing a conductive path through the circuit board, interconnect the top and the bottom via fields.

The via trace fields may include slight undulations so as to equalize the overall lengths of the trace-pairs in each differential bus. The via trace fields are also used selectively to reverse the trace or conductor order of groups of the trace-pairs, so that induced currents between the traces will cancel, minimizing crosstalk between them. This trace order reversal feature is also employed in the connector trace fields, to minimize crosstalk in an identical fashion.

The via fields may be oriented parallel with respect to collinearly arranged devices, or orthogonal with respect to devices or connectors which are parallel. Where a connector has laterally offset groups of pin connections, a via field may also include offset groups of vias to provide trace length equalization. These orthogonally oriented via fields also have the capability of equaling the lengths of the buses, and reversing the conductor order of the traces within the buses, to ensure the integrity of signal transfer between computer devices.

In the preferred microstrip construction, the trace-pairs are on the outside layers of the board, and the ground planes for each set of trace-pairs are buried in the board. Alternatively, in a stripline construction which is also disclosed, the trace-pairs are buried in the board, and the outer board surfaces are ground planes These and other objects of the apparatus of the present invention will be apparent in the drawings and in the detailed description of the preferred embodiment, to follow.

DETAILED DESCRIPTION OF THE PREFERRED EMBODIMENT

Figure 1:
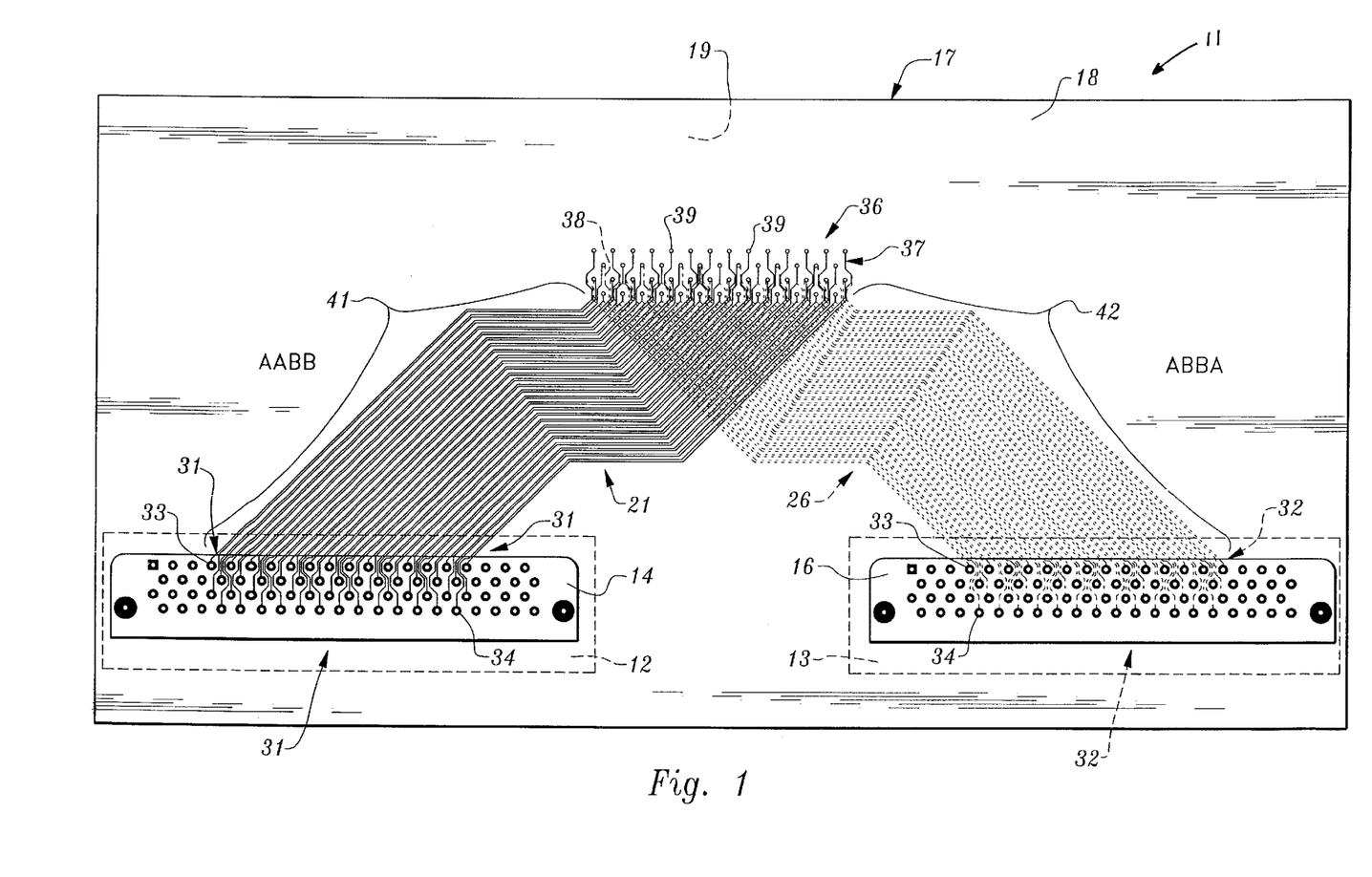
FIG. 1 is a top plan view of the apparatus of the present invention, showing two computer devices interconnected by a distributive bus and a via field.

Turning now to the drawings, FIG. 1 shows the most basic form of an apparatus 11, designed to support and interconnect computer devices 12 and 13. For purposes of clarity, devices 12 and 13 are only shown in broken outline form, each respectively overlying and plugged into, a first device connector 14 and a second device connector 16. Devices 12 and 13 may be any computer device, such as a disk drive or a processor.

The connectors 14 and 16 may be of any appropriate type for the application, but in this case, the connectors are removable, wide SCSI disk drive connectors, including an array of pin connections which is four rows high and twenty columns wide. The elongated connectors are mounted with their axes aligned, along one edge of a four-layered circuit board 17. It should be noted that the connectors may also be arranged in parallel relation, as will be discussed in more detail herein. In addition, the connectors may be used either for computer devices or for cable connections, as needs dictate.

Figure 5:
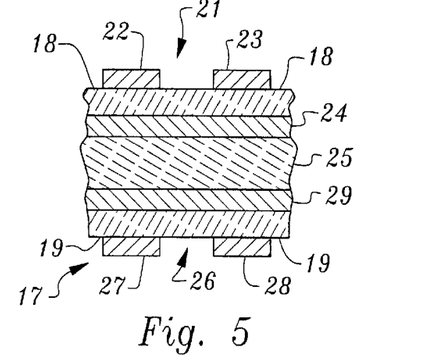
FIG. 5 is a fragmentary, cross-sectional view, taken to an expanded scale, of a microstrip circuit board, having top and bottom layer trace pairs, buried ground planes, and a center core.

Circuit board 17, known in the trade as a microstrip construction, is shown in a detailed cross-section, in FIG. 5. Board 17 has a top side 18 and a bottom side 19, made from "prepreg", a pre-impregnated dielectric material which has heat-activated adhesive properties. A top differential trace-pair 21, includes individual top traces 22 and 23, both arranged in spaced relation on top side 18. Immediately below top side 18 is a conductive ground plane 24. The combination of the spaced top traces 22 and 23, lying over top side 18 and ground plane 24, constitutes a controlled impedance layer for the transmission of digital signals. A core 25, also made from a dielectric material, is provided in the center of the board 17. This basic combination of elements is the building block of the differential bus used for interconnections throughout the apparatus 11 of the present invention.

On the other side of the circuit board, a bottom differential trace-pair 26 is provided, which includes individual bottom traces 27 and 28. Immediately above bottom side 19 is a conductive ground plane 29. These components form a controlled impedance layer used to provide differential bus interconnections on the bottom side of the circuit board 17.

Figure 7:
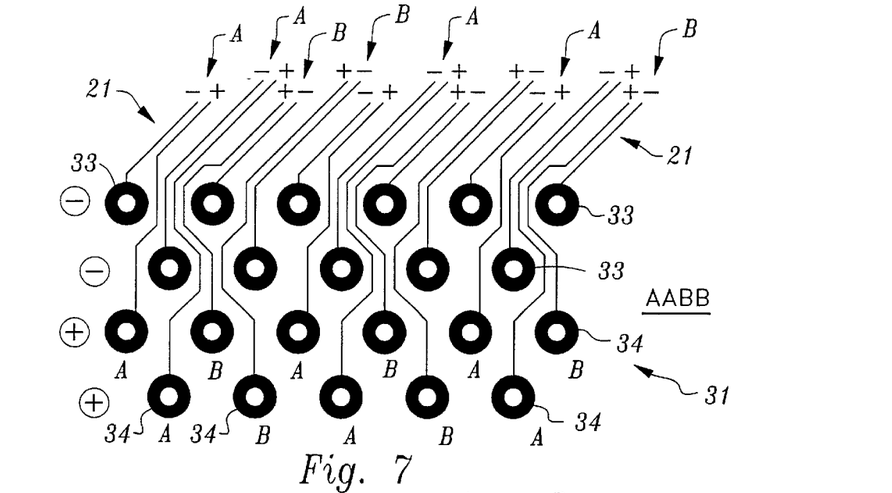
FIG. 7 is a connector and a via trace field, showing an AABB conductor order pattern.

Returning to FIG. 1, a first connector trace field 31 is interconnected to connector 14 and a second connector trace field 32 is interconnected to connector 16. Trace field 31 includes a plurality of top trace-pairs 21 which are variously connected to "negative" pins 33 and "positive" pins 34. The negative signs and positive signs on the left hand side of FIG. 7 are included to identify the polarities of particular pin rows. By following these pin polarities in conjunction with the respective trace lines leading from the pins, the subsequent explanation of the reversal of conductor, or trace order will be more clear. For convenience, the designation of pin connection order "A", for a particular trace pair, corresponds to a "negative" pin connection for the left hand trace, and a "positive" pin connection for the right hand trace. And, the designation of pin connection order "B", corresponds to a "positive" pin connection for the left hand trace and a "negative" pin connection for the right hand trace. It will be appreciated, then, that first connector trace field 31 displays a repetitive, conductor order pattern of AABB.

Figure 8:
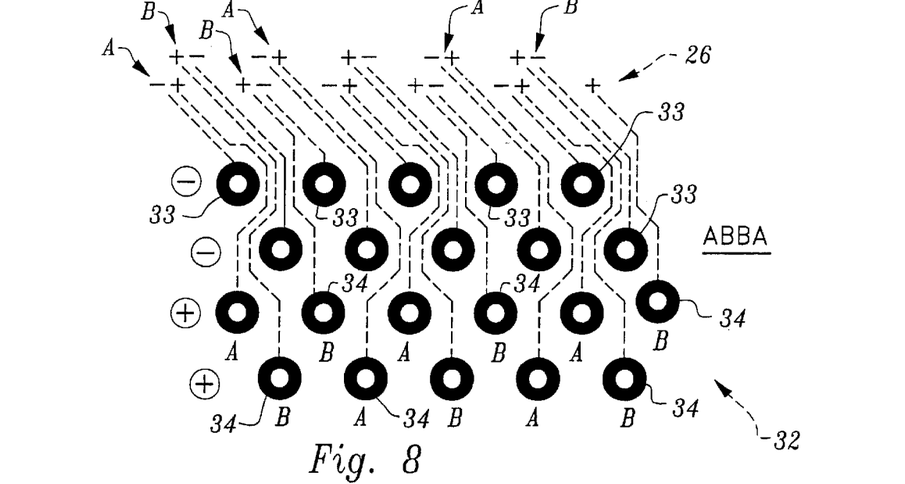
FIG. 8 is a connector and a via trace field, showing an ABBA conductor order pattern.

In FIG. 8, a different conductor order pattern is shown for the second connector trace field 32. Initially, it should be noted that trace field 32 is located on the bottom side 19 of circuit board 17. Thus, the trace-pairs of field 32 are shown in broken line in FIGS. 1 and 8. As in FIG. 7, the connector pins 33 and 34 are respectively marked as negative and positive. Proceeding from the upper left hand side of trace field 32 to the right, it is evident that a conductor order pattern of ABBA pattern is employed.

Interposed between the first connector 14 and the second connector 16 is a via trace field 36. One of the primary functions of the via field 36 is to effect a "fold-over" between two lengths of the differential bus. "Fold-over" refers to the corrective re-orientation of trace-pairs within a bus, so that pin connections between adjacent devices will be proper and symmetrical. In the application shown in FIG. 1, the via trace field 36 has an orientation which is parallel to the axis of the collinearly aligned connectors 14 and 16. As will be shown herein, other orientations for the via field may be used as well, depending upon the location and the orientation of the connectors to be interconnected. In addition, it is also preferable that via field 36 be precisely mid-way between the connectors 14 and 16. This location ensures that the top differential trace-pairs 21 and the bottom differential trace-pairs 26, are respectively of identical lengths, and essentially mirror images of each other.

Figure 9:
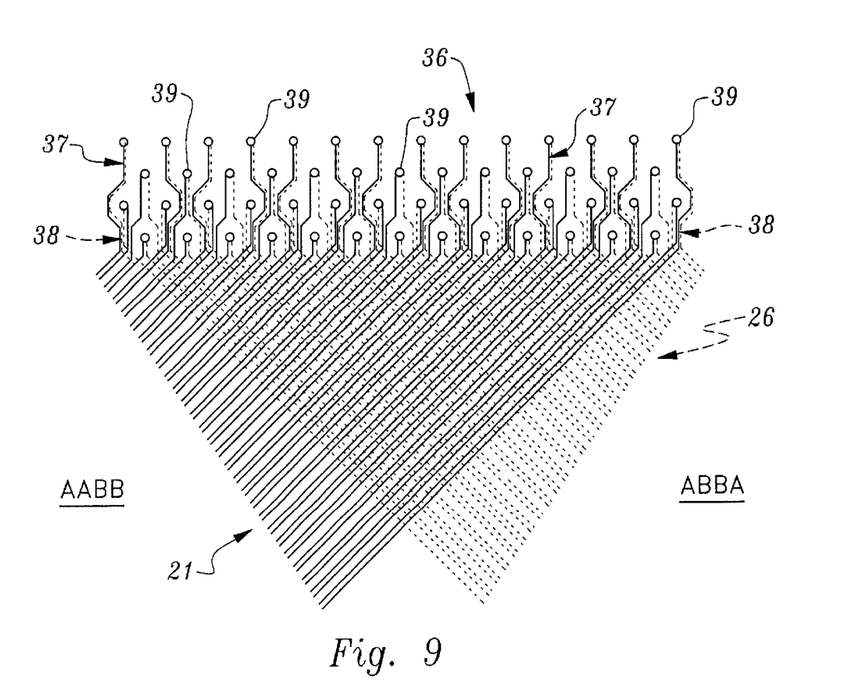
FIG. 9 is a plan view of a via field and the orthogonal trace-pairs on the top and the bottom of the circuit board.
Figure 10:
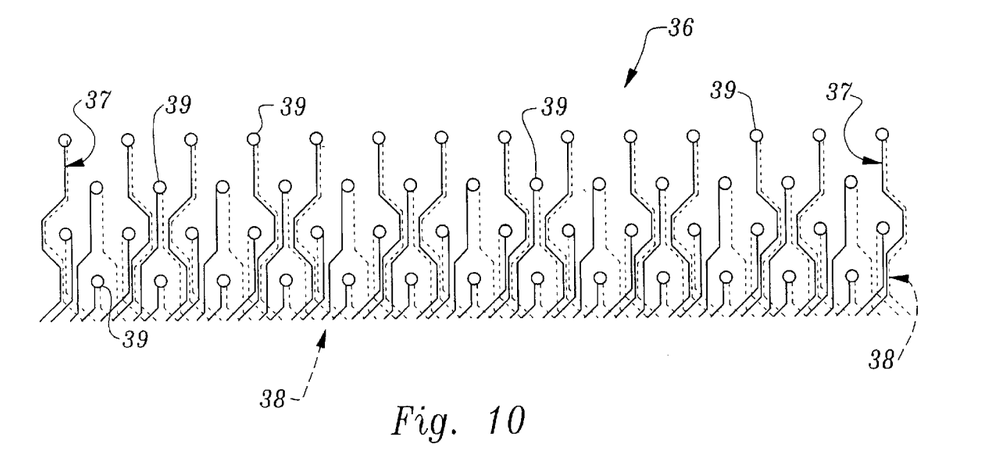
FIG. 10 is a plan view of the via field of FIG. 9, taken to an expanded scale, showing the manner of trace-pair length adjustment effected within the via field.

As shown in greater detail in FIGS. 9 and 10, via trace field 36 includes a top via field 37 and a bottom via field 38. Each of the trace-pairs in the top and bottom via fields is connected at one end to a respective via 39. The top via field 37 is connected to the vias 39 using the AABB conductor order pattern. This is the same conductor order pattern used by the first connector trace field 31. The bottom via field 38 is connected to the vias 39 using the ABBA conductor order pattern. This is the same conductor order pattern used by the second connector trace field 32. The twenty-seven pairs of vias 39 pass through the circuit board 17, and provide a conductive path between the top and bottom via trace fields. Thus, by means of the via field 36, different conductor order patterns in the trace-pairs may be effected, at the same time the differential bus is undergoing a "fold-over".

The top and bottom via trace fields 37 and 38, are substantially identical in size and configuration to the first and second connector trace fields 31 and 32. In addition, the number and the pattern of the vias 39 closely mirror the arrangement of the negative pins 33 and the positive pins 34 in the connectors 14 and 16. This general symmetry in trace field configurations and in pin and via arrangements, provides a uniform and complementary transformation for the differential bus as it passes between connectors. However, it should also be noted from a close examination from the detail of the trace fields in FIG. 10, that the small undulations in the trace paths provide an opportunity to make adjustments in the overall lengths of each trace. In this manner, the selective routing of trace paths through the via field provides a first mechanism through which the overall lengths of trace-paths in the bus can be equalized.

A plurality of top differential trace-pairs 21, comprising a first bus length 41, extends over the top side 18 of the board 17, between first connector trace field 31 and top via field 38. In traversing the distance between connector 14 and via field 36, first bus length 41 angles upwardly and to the right in a first path, then extends horizontally and to the right in a second path, and finally angles upwardly and to the right again in a third path. In identical fashion, a plurality of bottom differential trace-pairs 26, comprising a second bus length 42, extends over the bottom side 19 of the board, between second connector trace field 32 and bottom via field 38. Second bus length angles upwardly and to the left in a first segment, then extends horizontally and to the left in a second segment, and lastly angles upwardly and to the left again in a third segment.

Where the first and the second lengths of the bus cross over or under each other, they are orthogonal to each other (see, FIGS. 1 and 9). Such an orientation inherently reduces crosstalk between channels, as the magnetic fields produced by the top and bottom traces are perpendicular to each other. Moreover, this orientation reduces the proximal cross-over areas for the traces, minimizing capacitive coupling between the top and bottom traces.

In addition, the rearrangement of the conductor order patterns on either side of the via-field neutralizes crosstalk. Top trace-pairs 21 are organized with a trace-pair conductor order of AABB. In pattern A, the "negative" trace is routed to the left and the "positive" trace is routed to the right. In pattern B, the order is reversed. On the top side of the circuit board 17, stray capacitance and magnetic coupling between the positive trace of the first pair (pattern A) and the negative trace of the second pair (also pattern A) will cause crosstalk. If the first trace-pair has a positive signal transition, the positive conductor of the first trace-pair (culprit trace) will impart a positive perturbation on the negative member of the second trace-pair (victim trace). An identical influence will be caused between the third and fourth pairs, arranged in pattern BB.

On the bottom side of the circuit board, the pattern of the same first, second, third, and fourth pairs is rearranged to ABBA. The same positive signal transition referenced above, will cause an equal perturbation of the same polarity on the positive member of the second trace-pair on the bottom side of the board. The positive conductor of the first pair is still the culprit trace, but the now adjacent positive trace of the second pair is a new victim trace. Once the signal travels through the first and second bus lengths, both traces of the second pair will carry the same perturbation with the same polarity. However, the perturbation on the second pair is common-mode only. As a consequence of removing the differential component of the perturbation, the differential receivers of devices coupled to the bus do not respond to the perturbation.

In the first example of crosstalk neutralization, the culprit trace-pair remains with pattern A on both the top and the bottom of the circuit board. The victim trace-pair exchanges conductor order from the top side (pattern A) to the bottom side (pattern B). A different perturbation neutralization process occurs when the culprit trace-pair changes patterns and the victim trace pair retains the same conductor order. This circumstance arises from electromagnetic interaction between the second and the third trace-pairs.

If the second trace-pair has a positive signal transition, the positive conductor of the second trace-pair (the culprit trace) will impart a positive perturbation on the positive conductor of the third trace-pair (the victim trace). On the bottom side of the board, the negative conductor of the second pair now becomes the new culprit trace, inducing a negative perturbation on the same positive victim trace of the third trace-pair. Thus, an equal and opposite perturbation on the second length of the bus, cancels the initial perturbation imparted on the first length of the bus. In this case, the perturbation is completely canceled, leaving no differential or common mode components. These two perturbation neutralization mechanisms alternate between adjacent trace-pairs across the bus.

The mechanisms for crosstalk neutralization employed in the apparatus 11 are similar to the mechanism which cancels crosstalk in twisted pairs of wires within a bundled cable. In a bundled cable, there is a random distribution of twists between adjacent twisted pairs. When the cable is sufficiently long, the likelihood of a twisted pair inducing signal perturbations more in one polarity than the other diminishes to an acceptable level. In other words, the totality of coupled perturbations of opposite twisted pair members approximately cancels. The method of cancellation employed in the present invention is somewhat different, in that traces on a printed circuit board, rather than bundles of twisted pairs of wires, are the circuit conductors. Moreover, the method of cancellation used herein in somewhat more effective, as the symmetrical circuit topology coupled with the selective reversal of conductor ordering provides precisely opposing trace-pair influences in the differential bus extending between adjacent devices.

Figure 2:
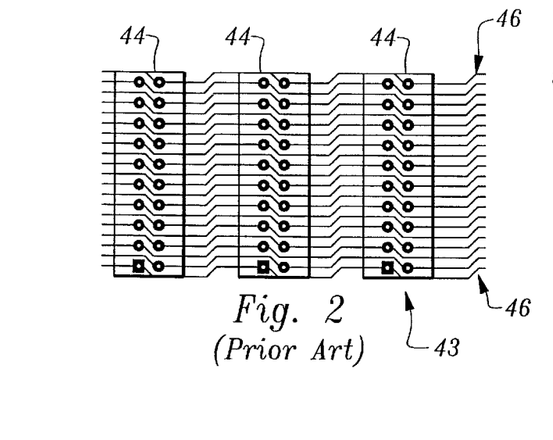
FIG. 2 is a prior art bus arrangement, in which the connectors of the computer devices are mounted directly over and connected to the bus traces, in parallel fashion.

Prior art circuit board arrangements, in contrast, do not exhibit the same efficiency and versatility for arranging computer devices on a circuit board, without compromising the circuit's immunity from crosstalk. For example, in FIG. 2 a prior art bus arrangement 43 is shown, in which the connectors 44 of the computer devices are mounted directly over and connected to the parallel bus traces 46. Although this provides very straightforward routing for the bus traces, it is limited in use to circumstances where the computer devices may be vertically oriented.

Figure 3:
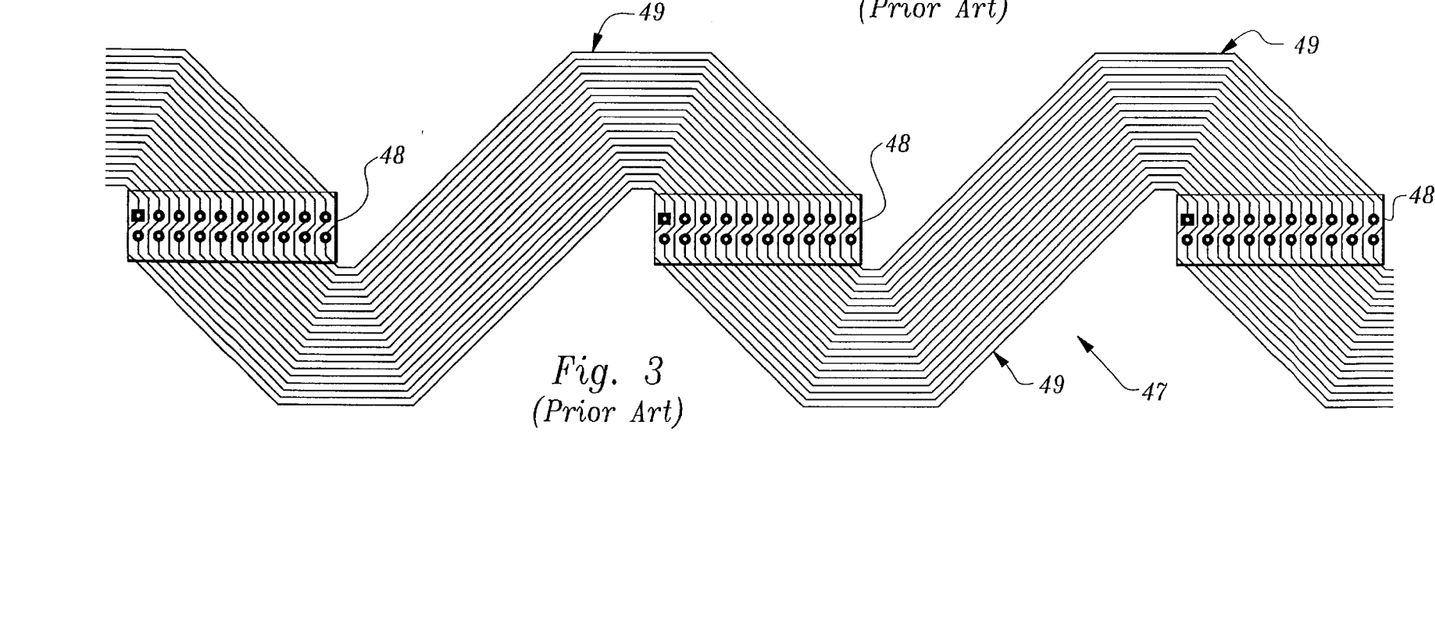
FIG. 3 is a prior art bus arrangement, in which the connectors of the computer devices are collinearly aligned, and in which the bus traces alternatively undulate above and below the connectors.

If the computer devices are to be horizontally oriented, the bus traces must follow a sinuous path in and around the device connectors to maintain the same pin sequence. This prior art bus arrangement 47 is shown in FIG. 3. In arrangement 47, the device connectors 48 are mounted with their axes horizontal, and collinearly aligned. However, to maintain the proper pin connection sequence, the bus 49 must undergo a 180 degree re-orientation path, which consumes a considerable amount of circuit board space on both sides of the connectors. In addition, it prevents the device connectors from being mounted along the edge of the circuit board.

Figure 4:
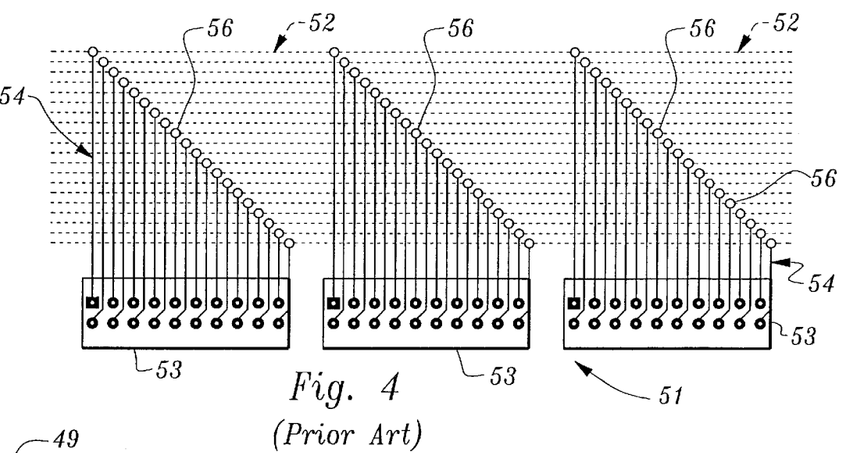
FIG. 4 is prior art bus arrangement, in which the connectors of the computer devices are collinearly aligned, and connected to a parallel bus by means of stubs.

In FIG. 4, yet another prior art bus arrangement 51 is shown. In arrangement 51, the parallel bus 52 is located on the bottom side of the board (not shown). Bus 52 is therefore illustrated in broken line. Each device connector 53 is interconnected to the bus 52 by means of a respective stub 54. Arrangement 51 accomplishes bus "fold-over" by using both sides of the circuit board, and vias 56 passing through the circuit board, to connect the end of the stubs 54 with the bus 52. As has been mentioned previously, however, stubs create signal reflections in the bus, as the stubs are not properly terminated with a load and they are oriented transversely with respect to the bus.

Figure 11:
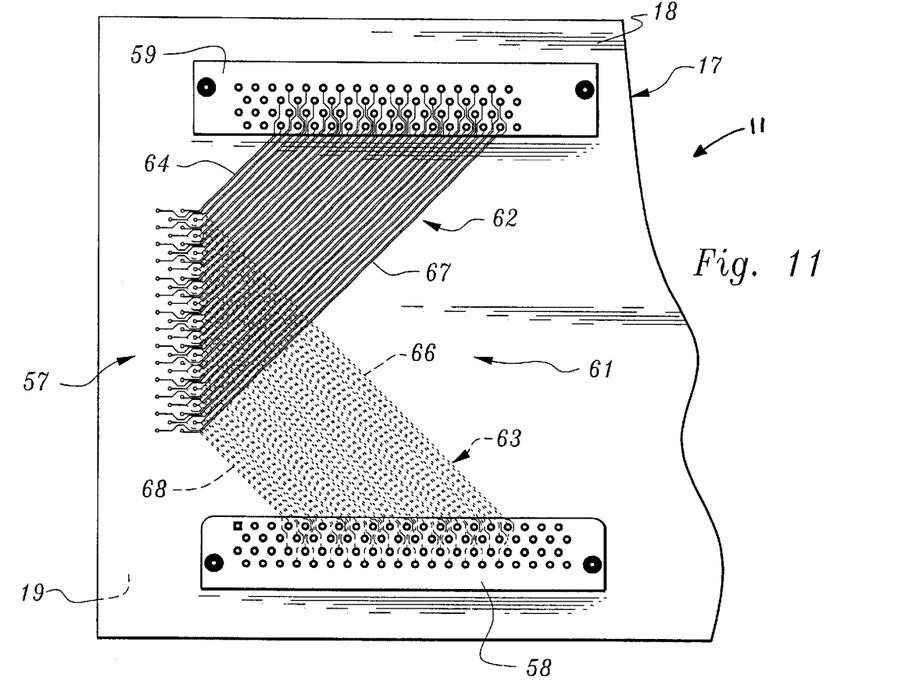
FIG. 11 is a plan view of the connectors of two devices, located on opposing edges of the circuit board, being interconnected with a via field.

Having presented the apparatus 11 in its most basic form and explained its operational features and advantages over the prior art bus arrangements, we can now turn to a disclosure of several adaptations of the same principles to other requirements for mounting and interconnecting devices and connectors. In FIG. 11, an example of a via field 57 being oriented orthogonally with respect to parallel connectors 58 and 59, is shown. Connectors 58 and 59 may accept two computer devices, a computer device and a cable, or two cables. In contrast to the example shown in FIG. 1, the connectors 58 and 59 are mounted with their axes offset, in parallel relation, along opposing upper and lower edges of a circuit board 17. A differential bus 61, including a plurality of trace pairs, interconnects connectors 58 and 59.

Via field 57 is identical in construction to via field 36, described previously. However, owing to its orientation with respect to the axes of the connectors 58 and 59, the via field 57 is not in the center of each of the trace-pairs within bus 61. A top trace run 62 extends downwardly and to the left, from connector 59 to via field 57. Top trace run 62 lies over the top side 18 of circuit board 17. A bottom trace run 63 extends downwardly and to the right, from via field 57 to connector 58. Bottom trace run 63 lies over the bottom side 19 the circuit board. It should be noted that while the total lengths of the trace-pairs are equal, the lengths of each trace-pair on the top side of the board are not equal to the respective lengths on the bottom side of the board. For example, short trace-pair 64 on the top of the board is interconnected through the via field 57 to long trace-pair 66, on the bottom of the board. And, long trace-pair 67 on the top of the board is interconnected through the via field to short trace-pair 68 on the bottom of the board.

The ratios of these unequal lengths of trace-pairs, between the top side and the bottom side of the board, will vary depending upon the pin placements for the connectors 58 and 59. This is a disadvantage for crosstalk neutralization, where introduction of an equal and opposite perturbation is effected through conductor order reversals. This may be compensated for, to some degree, by providing a similar "balancing" interconnection of components, elsewhere on the circuit board. For example, trace-pairs that are long on the top of one interconnection arrangement are short on the bottom trace-pairs in the balancing interconnection arrangement. This feature will be discussed more fully below, where a practical circuit board construction is explained.

Figure 12:
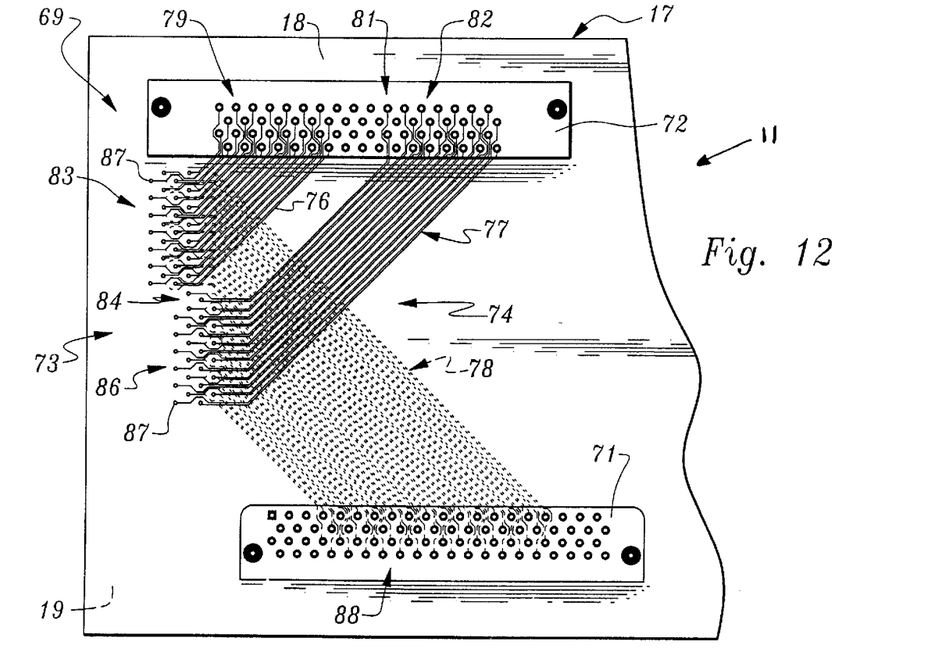
FIG. 12 is a plan view of the connectors of a hard drive and a cable connector, located on opposing edges of the circuit board, being interconnected with a via field with displaced groups of pins to effect trace length adjustment; and, FIG. 13 is a plan view of a circuit board incorporating the features of the present invention, and including four drives and two cable connectors, all interconnected by a differential bus with via fields.

The necessity to balance influences within an interconnection arrangement is further complicated where the pins in at least one of the connectors are broken up into two or more groups which are horizontally or laterally displaced with respect to each other. In FIG. 12, a typical interconnection arrangement 69 between a device connector 71 and a cable connector 72 is shown. Although device connector 71 has a conventional and continuous line of pin connections, cable connector 72 has three groupings of pin connections. Owing to this offset or displaced relation of connector pin groupings, a special compensating via field 73 is provided to equalize the lengths of the bus trace pairs.

A differential bus 74 includes a first top trace group 76 and a second top trace group 77. Bus 74 also includes a bottom trace group 78, shown in broken line in FIG. 12, as group 78 runs along the bottom side 19 of the circuit board. Cable connector 72 includes a first connector field 79, a second connector field 81, and a third connector field 82. Via field 73 includes an upper field group 83, a middle field group 84, and a lower field group 86. These field groups have corresponding traces both on the top side and the bottom side of the circuit board which are interconnected to each other by vias 87. For the sake of simplicity, these structures, which have already been discussed in great detail above, will not be explained further as their construction is identical.

First trace group 76 interconnects first connector field 79 with upper field group 83. Second trace group 77 interconnects second connector field 81 with middle field group 84 and third connector field 82 with lower field group 86. Bottom trace group 78 interconnects the upper, middle, and lower field groups of field 73 with a device connector field 88. Because connector fields 79, 81 and 82 are laterally displaced with respect to each other, the field groups 83, 84, and 86 are correspondingly horizontally offset so that the overall lengths of the trace-pairs in bus 74 will be equalized. It should be noted that middle field group 84 is slightly vertically displaced with respect to the adjacent trace in lower field group 86, so as to compensate for the slight lateral displacement between connector fields 81 and 82. Thus, horizontal and vertical displacement of groups of the trace-pairs within the via field, provides yet another mechanism to equalize overall lengths of the bus trace-pairs.

Figure 13:
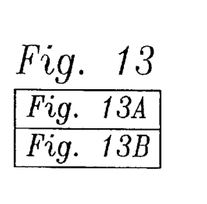
Figure 13A:
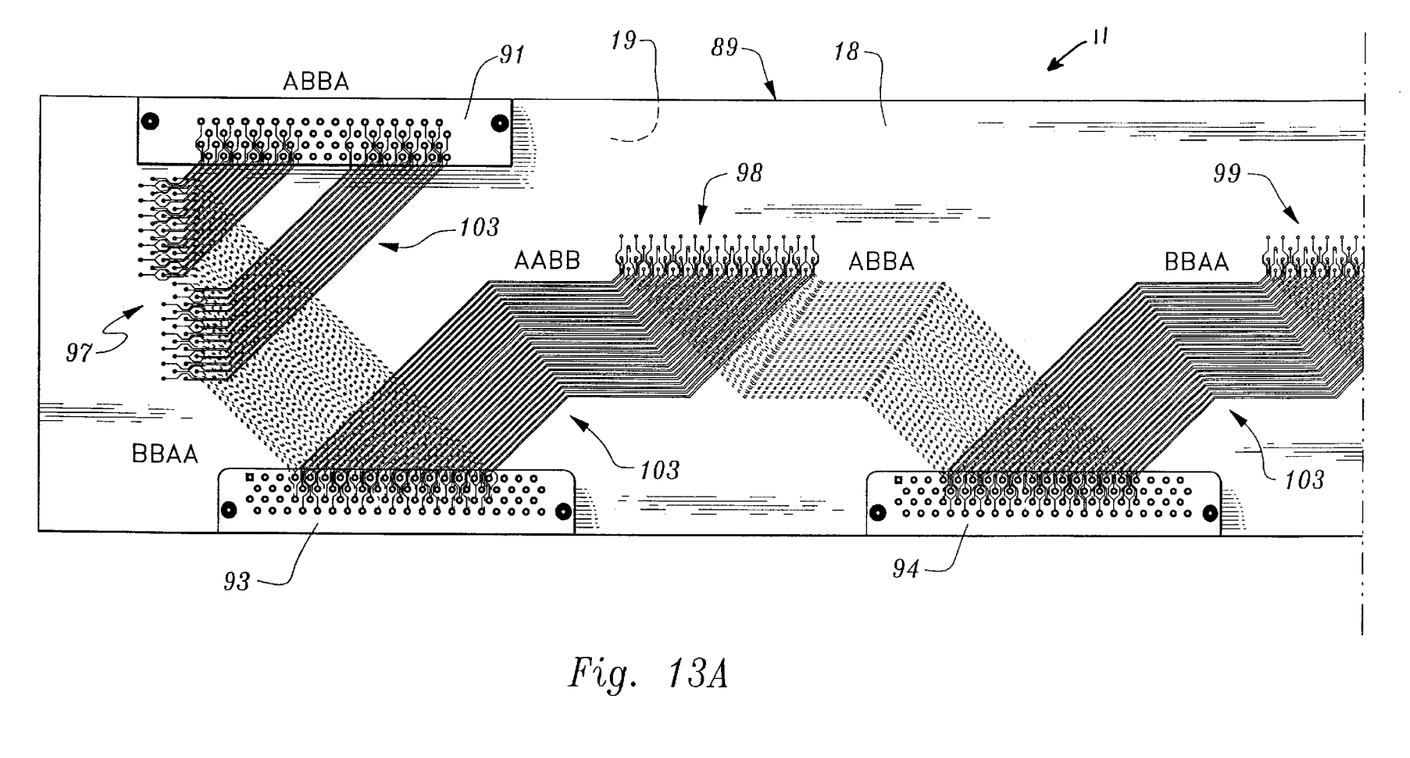
Figure 13B:
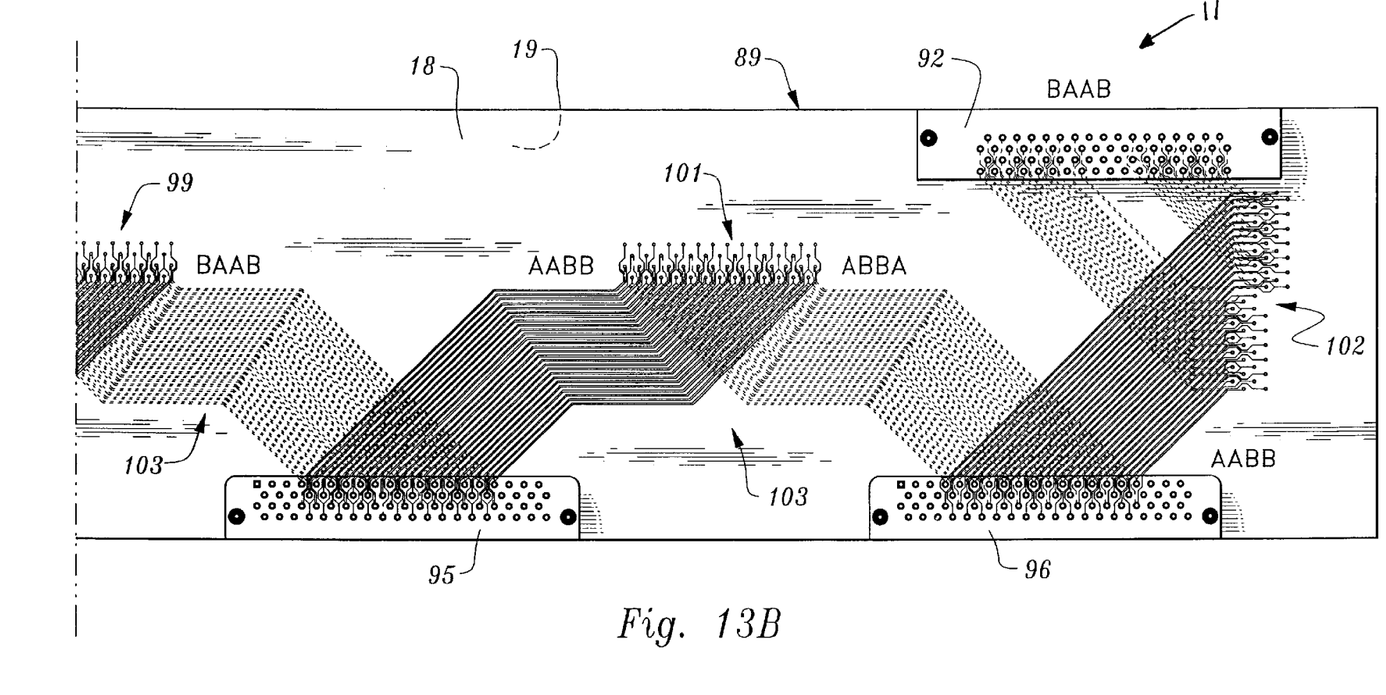

Turning now to FIG. 13, a practical application of the apparatus 11 of the present invention is shown. SCSI backplane circuit board 89 includes a first SCSI cable connector 91 and a second SCSI cable connector 92, at its upper corners. Disk drive connectors 93, 94, 95, and 96 are mounted along the lower edge of board 89. A left via field 97 is provided between cable connector 91 and disk drive connector 93. An intermediate via field 98 is provided between disk drive connector 93 and disk drive connector 94. An intermediate via field 99 is provided between disk drive connector 94 and disk drive connector 95. An intermediate via field 101 is provided between disk drive connector 95 and disk drive connector 96. And, a right via field 102 is provided between disk drive connector 96 and cable connector 92.

Starting with the upper left hand corner of board 89, it will be noted that the conductor order pattern for the trace pairs has been provided for each link of segment of the differential bus 103. For example, in the first top segment of the bus, from connector 91 to left via field 97, an ABBA conductor order pattern is employed. Then, in the first bottom segment of the bus, from left via field 97 to connector 93, a BBAA conductor order pattern is used. It should be noted that the "balancing" interconnection arrangement, comprising connectors 92, right via field 102, and connector 96, use a BAAB and an AABB conductor order pattern. For this special interconnection case, the desired objective is still to achieve equal and opposite influence between each trace-pair and adjacent neighbor pairs. However, this is accomplished by choosing conductor order patterns which maintain an equal ratio of segment lengths with "same letter" pairings (i.e. AA or BB) and "opposite letter" pairings (i.e. AB or BA) between adjacent trace-pairs.

The first and second trace-pairs are routed with pairing AB on the top side of the board. This is a short segment. Pairing BA is selected for these two pairs on the bottom layer of the "balancing" arrangement. This is a long segment. The sum of these two segment lengths equals half of the total trace lengths for these trace-pairs in both interconnection arrangements. Equal and opposite perturbations are created on the bottom layer of the left arrangement and the top layer of the right arrangement, where the pattern pairs are BB and AA, respectively. Thus, crosstalk is neutralized for devices which lie on either side of these arrangements. Crosstalk is reduced but not perfectly neutralized for devices which lie between these interconnection arrangements.

Conductor order patterns for the interconnections between the disk drives 93 and 94 change from an AABB to an ABBA, consistent with the prior explanations given. Similarly, conductor order patterns for the interconnections made to disk drive 94 change the conductor order from an ABBA pattern to a BBAA pattern. This is an example of the connector trace fields being used to change conductor order pattern in precisely the same fashion as the via fields accomplish the same task. Via field 99 then changes the pattern from a BBAA to a BAAB pattern. The conductor order pattern change occurs again in the connector fields of disk drive 95 (BAAB to AABB). This returns the AABB to ABBA pattern for interconnections between drives 95 and 96.

Figure 6:
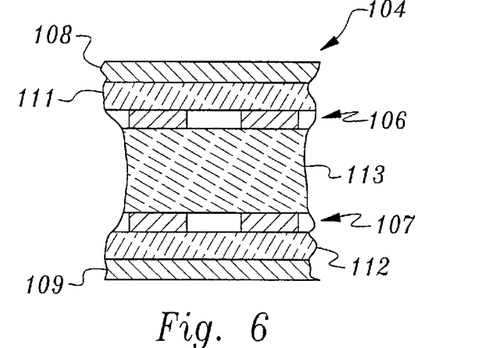
FIG. 6 is a fragmentary, cross-sectional view, taken to an expanded scale, of a stripline circuit board, having top and bottom ground planes, buried trace-pairs, and a center core.

Although all of the circuit board constructions described thus far have been of microstrip design, the apparatus 11 of the present invention may also be used advantageously in connection with stripline circuit boards. Such a stripline construction 104, is shown in FIG. 6. While microstrip construction has an inherently high impedance, a stripline construction results in a characteristic low impedance between trace-pairs.

A stripline construction includes trace-pairs 106 and 107 which are buried in the board. The outer surfaces of the board comprise top and bottom grounded planes 108 and 109. A first prepreg dielectric layer 111 is provided between trace-pair 106 and ground plane 108; and a second prepreg dielectric layer 112 is included between trace-pair 107 and ground plane 109. As with the microstrip board, a core 113 is provided in the center of the stripline 104.

Because the trace-pairs 106 and 107 are relatively close in the stripline, with no ground plane between them, it may be desirable in certain applications to add such a ground plane, or additional layers of dielectric, to minimize crosstalk between the strip-lines. On the other hand, this modification may not be necessary, as the traces in the cross-over areas adjacent the via fields are always orthogonal with respect to each other, minimizing electro-magnetic coupling between layers of trace-pairs.

What is claimed is:

1. An apparatus for supporting and interconnecting electronic devices, comprising:
   a. a circuit board having a top side and a bottom side;
   b. a first connector, said first connector including a first plurality of pins being connected to a first connector trace field on or within said top side;
   c. a second connector, said second connector including a second plurality of pins being connected to a second connector trace field on or within said bottom side;
   d. a via trace field, said via trace field including a top via field and a bottom via field, said top and bottom via fields being substantially identical in size and configuration to said first and second connector trace fields, said via trace field being located on or within said board between said first and second connectors, said via trace field including via connectors passing through said board and interconnecting said top and bottom via fields;
   e. a plurality of top differential bus trace pairs on or within said top side of said board, interconnecting said first connector field and said top via field; and,
   f. a plurality of bottom differential bus trace pairs on or within said bottom side of said board, interconnecting said second connector field and said bottom via field.

2. An apparatus as in claim 1, in which said top and bottom via fields include trace-pairs and in which unequal undulations are provided in at least one of said trace-pairs, to provide equalization between an overall length of said one trace-pair with an overall length of other said trace-pairs.

3. An apparatus as in claim 1, in which said first and second connectors have collinear longitudinal axes, and in which said via field has a longitudinal axis which is in parallel, spaced relation with respect to said longitudinal axes of said connectors.

4. An apparatus as in claim 3, in which said via field is located midway between said first and second connectors.

5. An apparatus as in claim 1, in which said first and second connectors have longitudinal axes which are parallel and in spaced relation, and in which said via field has a longitudinal axis which is orthogonal with respect to said longitudinal axes of said connectors.

6. An apparatus as in claim 5 in which one of said connectors has groups of connector fields which are laterally displaced with respect to each other, and said via field has via field groups which are offset with respect to each other to compensate for differences lengths of said top and bottom differential trace pairs, effected by said lateral displacement of said connector fields.

7. An apparatus as in claim 1 in which said top via field and said bottom via field include conductor order pattern reversals between selected ones of said top and bottom differential trace pairs.

8. An apparatus as in claim 7 in which a negative/positive conductor order is designated A, and a positive/negative conductor order is designated B, and in which said conductor order on said top differential trace pairs displays an AABB pattern, and in which said conductor order on said bottom differential trace pairs displays an ABBA pattern.

9. An apparatus as in claim 7 in which a negative/positive conductor order is designated A, and a positive/negative conductor order is designated B, and in which said conductor order on said top differential trace pairs displays a BBAA pattern, and in which said conductor order on said bottom differential trace pairs displays an BAAB pattern.

10. An apparatus as in claim 7 in which a negative/positive conductor order is designated A, and a positive/negative conductor order is designated B, and in which said conductor order on said top differential trace pairs displays an ABBA pattern, and in which said conductor order on said bottom differential trace pairs displays a BBAA pattern.

11. An apparatus as in claim 7 in which a negative/positive conductor order is designated A, and a positive/negative conductor order is designated B, and in which said conductor order on said top differential trace pairs displays a BAAB pattern, and in which said conductor order on said bottom differential trace pairs displays an AABB pattern.

12. An apparatus as in claim 7, in which said conductor order reversals are selectively made in a repetitive pattern, to neutralize crosstalk between said top and bottom trace-pairs.

13. An apparatus for supporting and interconnecting electronic devices, comprising:
   a. a circuit board having a top side and a bottom side;
   b. a first connector, said first connector including a first plurality of pins being connected to a first connector trace field on or within said top side;
   c. a second connector, said second connector including a second plurality of pins being connected to a second connector trace field on or within said bottom side;
   d. differential trace means for interconnecting said first connector trace field and said second connector trace field, said differential trace means including a via trace field having a top via field and a bottom via field, said top and bottom via fields being substantially identical in size and configuration to said first and second connector trace fields, said via trace field being located on or within said board between said first and second connectors, said via trace field including via connectors passing through said board and interconnecting said top and bottom via fields.

14. An apparatus as in claim 13, in which said top and bottom via fields include trace-pairs and in which unequal undulations are provided in at least one of said trace-pairs, to provide equalization between an overall length of said one trace-pair with an overall length of other said trace-pairs.

15. An apparatus as in claim 13, in which said first and second connectors have collinear longitudinal axes, and in which said via field has a longitudinal axis which is in parallel, spaced relation with respect to said longitudinal axes of said connectors.

16. An apparatus as in claim 13, in which said via field is located midway between said first and second connectors.

17. An apparatus as in claim 13, in which said first and second connectors have longitudinal axes which are parallel and in spaced relation, and in which said via field has a longitudinal axis which is orthogonal with respect to said longitudinal axes of said connectors.

18. An apparatus as in claim 17 in which one of said connectors has groups of connector fields which are laterally displaced with respect to each other, and said via field has via field groups which are offset with respect to each other to compensate for differences lengths of said differential trace means, effected by said lateral displacement of said connector fields.

19. An apparatus as in claim 13 in which said top via field and said bottom via field include conductor order pattern reversals.

20. An apparatus as in claim 19 in which a negative/positive conductor order is designated A, and a positive/negative conductor order is designated B, and in which said conductor order on said top via field displays an AABB pattern, and in which said conductor order on said bottom via field displays an ABBA pattern.

21. An apparatus as in claim 19 in which a negative/positive conductor order is designated A, and a positive/negative conductor order is designated B, and in which said conductor order on said top via field displays a BBAA pattern, and in which said conductor order on said bottom via field displays an BAAB pattern.

22. An apparatus as in claim 19 in which a negative/positive conductor order is designated A, and a positive/negative conductor order is designated B, and in which said conductor order on said top via field displays an ABBA pattern, and in which said conductor order on said bottom via field displays a BBAA pattern.

23. An apparatus as in claim 19 in which a negative/positive conductor order is designated A, and a positive/negative conductor order is designated B, and in which said conductor order on said top via field displays a BAAB pattern, and in which said conductor order on said bottom via field displays an AABB pattern.

24. An apparatus as in claim 19, in which said differential trace means includes upper trace pairs and lower trace pairs, and in which said conductor order reversals are selectively made in a repetitive pattern, to neutralize crosstalk between said upper and lower trace-pairs.

25. An apparatus for supporting and interconnecting electronic devices, comprising:
   a. a circuit board having a top side and a bottom side;
   b. a first connector, said first connector including a first plurality of pins being connected to a first connector trace field on or within said top side;
   c. a second connector, said second connector including a second plurality of pins being connected to a second connector trace field on or within said bottom side;
   d. a via trace field, said via trace field including a top via field and a bottom via field, said top and bottom via fields being substantially identical in size and configuration to said first and second connector trace fields, said via trace field being located on or within said board between said first and second connectors, said via trace field including via connectors passing through at least a portion of said board and interconnecting said top and bottom via fields;
   e. a plurality of top differential bus trace pairs within said top side of said board, interconnecting said first connector field and said top via field; and,
   f. a plurality of bottom differential bus trace pairs within said bottom side of said board, interconnecting said second connector field and said bottom via field.

* * * * *